United States Patent [19]

Nagatomo

[11] Patent Number: 5,047,359

[45] Date of Patent: Sep. 10, 1991

[54] METHOD OF IMPLANTING INTO THE SIDEWALL OF A TRENCH BY ROTATING THE WAFER

[75] Inventor: Masao Nagatomo, Hyogo, Japan

[73] Assignee: Mitsubishi Denki Kabushiki Kaisha, Tokyo, Japan

[21] Appl. No.: 342,673

[22] Filed: Apr. 26, 1989

Related U.S. Application Data

[63] Continuation of Ser. No. 93,529, Aug. 17, 1987, abandoned.

[30] Foreign Application Priority Data

Dec. 17, 1985 [JP] Japan ................................ 60-284686

[51] Int. Cl.⁵ .......................................... H01L 21/266
[52] U.S. Cl. ........................................ 437/35; 437/63; 437/932
[58] Field of Search ...................... 437/35, 63, 61, 932

[56] References Cited

U.S. PATENT DOCUMENTS

| | | | |
|---|---|---|---|
| 3,388,009 | 6/1968 | King | 437/35 |
| 4,404,233 | 9/1983 | Ikeda | 437/35 |
| 4,532,696 | 8/1985 | Iuai | 437/67 |

FOREIGN PATENT DOCUMENTS

| | | | |
|---|---|---|---|
| 0004810 | 2/1972 | Japan | 437/35 |
| 0084553 | 7/1978 | Japan | 437/35 |
| 0119671 | 10/1978 | Japan | 437/35 |
| 0075235 | 6/1980 | Japan | 437/35 |
| 0165341 | 8/1980 | Japan . | |
| 0105324 | 9/1983 | Japan . | |

OTHER PUBLICATIONS

Chandhi, S. K., VLSI Fabrication Principles, 1983, pp. 304-305.
Translation of Kakai #105324.

Primary Examiner—Brian E. Hearn
Assistant Examiner—Chandra Chaudhari
Attorney, Agent, or Firm—Lowe, Price, LeBlanc and Becker

[57] ABSTRACT

The present invention relates to a method of manufacturing a semiconductor device. In order to controllably introduce impurities into the side wall of a trench $2a$ by ion implantation impurity ions are directed at a predetermined angle into the side wall of the trench $2a$ provided in a wafer $2a$ and, for implantation thereof, at the same time, the wafer 2 is rotated around an ion implantation axis at a rotational speed related to the ion implantation current.

3 Claims, 1 Drawing Sheet

METHOD OF IMPLANTING INTO THE SIDEWALL OF A TRENCH BY ROTATING THE WAFER

This application is a continuation of application Ser. No. 07/093,529, filed Aug. 17, 1987, now abandoned.

FIELD OF THE INVENTION

The present invention relates to a method of manufacturing a semiconductor device and, more particularly, to an ion implantation technique useful in the manufacturing of a semiconductor device.

BACKGROUND OF THE INVENTION

Isolation in a conventional semiconductor device has been achieved using a planar technique. However, with high integration, it is becoming difficult to incorporate many elements within an allowed chip size using only the conventional planar technique. It is considered beneficial to have a trench structure introduced into an isolation layer or capacitance in a DRAM. However, when such a trench structure is used, it is necessary to controllably introduce impurities such as boron or arsenic into the side wall of the trench in the manufacturing processes for producing the semiconductor device.

DISCLOSURE OF THE INVENTION

Since a method of manufacturing a conventional semiconductor device comprises the above described process, solid phase diffusion utilizing BPSG, AsSG or the like, and vapor phase diffusion by gas are used to introduce impurities. However, there is a problem in obtaining the desired controllability over formation of an impurity layer. When controllability in forming a shallow impurity layer is poor, it prevents production of a high quality or fine semiconductor device.

An object of the present invention is to solve the above described problem and to obtain a method of manufacturing a semiconductor device in which impurities can be controllably introduced into the side wall of a trench by ion implantation and a shallow impurity layer required for a fine device can be formed.

A method of manufacturing a semiconductor device according to the present invention is adapted such that impurity ions are obliquely ion-implanted into the side wall of a trench provided in a wafer and, at the same time, the wafer is rotated around an ion implantation axis.

In a method of manufacturing a semiconductor device according to the present invention, impurity ions are obliquely ion-implanted into the side wall of a trench and, at the same time, the wafer is rotated around an ion implantation axis so that a shallow impurity layer can be controllably formed in the vicinity of the trench.

DESCRIPTION OF THE BEST MODE

Figure 1:
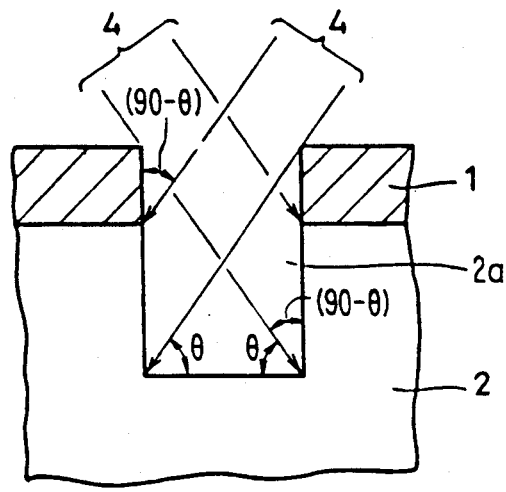
FIGS. 1 and 2 are cross sectional views illustrating details of sequential processes in a method of manufacturing a semiconductor device according to a preferred embodiment of the present invention.
Figure 2:
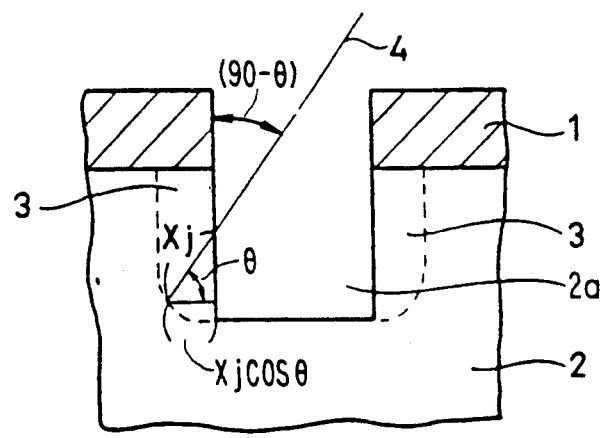
Figure 3:
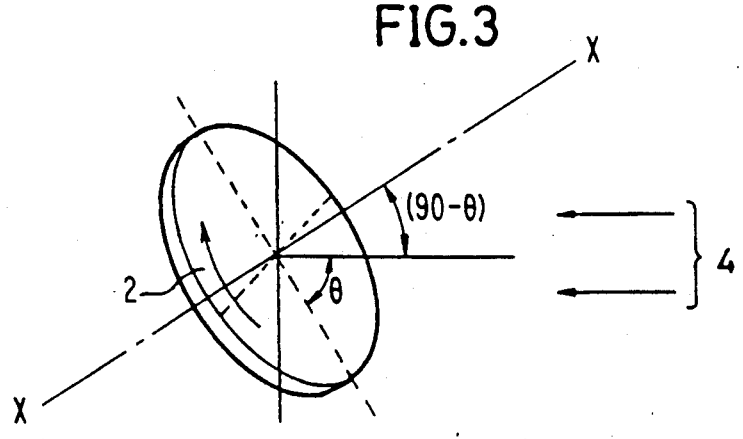
FIG. 3 is a diagram for explaining how a wafer is rotated at the time of ion implantation.

Referring to the drawings, in FIGS. 1 to 3 there are shown an ion implantation mask 1, a wafer 2, a trench 2a provided in the wafer 2 an ion implantation layer 3, and an ion beam 4.

The best mode for practicing the process will now be described. As illustrated in FIG. 1, an ion implantation angle $\theta$ is first set in accordance with the aspect ratio of the depth to the width of the trench 2a including the thickness of the ion implantation mask 1. It is preferable that the ion implantation angle $\theta$ be within the range of 45° to 90° to the surface of the wafer 2. However, it is necessary to further incline the actual ion implantation angle $\theta$ by 7°, as compared with the set ion implantation angle $\theta$, so that chattering does not occur on an ion implantation axis and the surface of the ion implantation mask 1.

Furthermore, the wafer 2 is inclined relative to the ion implantation axis in accordance with the aspect ratio, as best understood with reference to FIG. 3, so that the entire surface of the side wall of the trench 2a is uniformly doped. The wafer 2 is rotated at an optimum angular velocity, that depends on the implantation current.

Thus, as shown in FIG. 2, the junction depth $Xj\theta$ at the time of ion implantation at an angle of $\theta$ equals approximately $Xj\sin\theta$ relative to the junction depth $Xj$ at the time of ion implantation at an angle of 90°, so that the shallow ion implantation layer (3) can be controllably formed. In addition, if ion implantation is set in accordance with the angle $\theta$, the ion implantation layer 3 having the same impurity concentration as that at the time of ion implantation at an angle of 90° can be formed.

As described in the foregoing, according to the present invention, ions are implanted at an angle to the ion implantation axis and the wafer is rotated an angular velocity depending on the implantation current, in method of manufacturing a semiconductor device in which the ion implantation layer can be controllably formed on the side surface of the trench of the wafer.

What is claimed:

1. A method of manufacturing a semiconductor device having portions at which impurity ions are implanted, comprising the steps of:

forming a trench of a predetermined depth and width in a substrate surface of a wafer, for forming an impurity ion implantation region therein at a surface of a side wall of the trench;

forming an ion implantation mask of a predetermined thickness on said substrate surface of said wafer except for said trench;

mounting said wafer for rotation thereof about a rotation axis, such that an acute angle $(90-\theta)$, where $\theta$ is within the range 45° to 90°, formed between side wall surface of said trench and a direction of impurity ion implantation is determined according to the relationship tan $(90-\theta)$ (said width of said trench)/(sum of said ion implantation mask thickness+said depth of said trench);

forming said thin ion implantation region, by rotating said mounted wafer about said rotation axis at an angular velocity depending on an implantation current of said impurity ions and implanting the impurity ions to said inner surface of said side wall of said trench while said wafer is being rotated.

2. A method of manufacturing a semiconductor device in accordance with claim 1, wherein:

the wafer is mounted to be inclined with respect to said rotation axis at an angle greater than the acute angle $(90-\theta)$ by a predetermined amount.

3. A method of manufacturing a semiconductor device in accordance with claim 2, wherein:

said predetermined amount is approximately 7°.

* * * * *